United States Patent [19]

Jobling

[11] Patent Number: 5,023,564
[45] Date of Patent: Jun. 11, 1991

[54] AMPLFIER CIRCUIT

[75] Inventor: David T. Jobling, Geneva, Switzerland

[73] Assignee: Motorola, Inc., Schaumburg, Ill.

[21] Appl. No.: 434,212

[22] Filed: Nov. 13, 1989

[30] Foreign Application Priority Data

Nov. 18, 1988 [GB] United Kingdom ............. 8827071.5

[51] Int. Cl.$^5$ ............................................. H03F 1/34
[52] U.S. Cl. .................................... 330/107; 330/294
[58] Field of Search ............... 330/107, 150, 152, 294, 330/311, 109, 110

[56] References Cited

U.S. PATENT DOCUMENTS

| 4,481,480 | 11/1984 | Metz | 330/294 |
|---|---|---|---|
| 4,513,254 | 4/1985 | Horr | 330/294 |
| 4,786,880 | 11/1988 | Voorman | 330/294 |

*Primary Examiner*—Steven Mottola
*Attorney, Agent, or Firm*—Bradley J. Botsch

[57] ABSTRACT

An amplifier circuit is described comprising a transconductance amplifier in series with a voltage gain stage. A compensation capacitance coupled across the voltage gain stage includes a capacitance whose value is dependent upon the output voltage of the voltage gain stage so as to optimize amplifier stability over a wide range of output voltages.

3 Claims, 1 Drawing Sheet

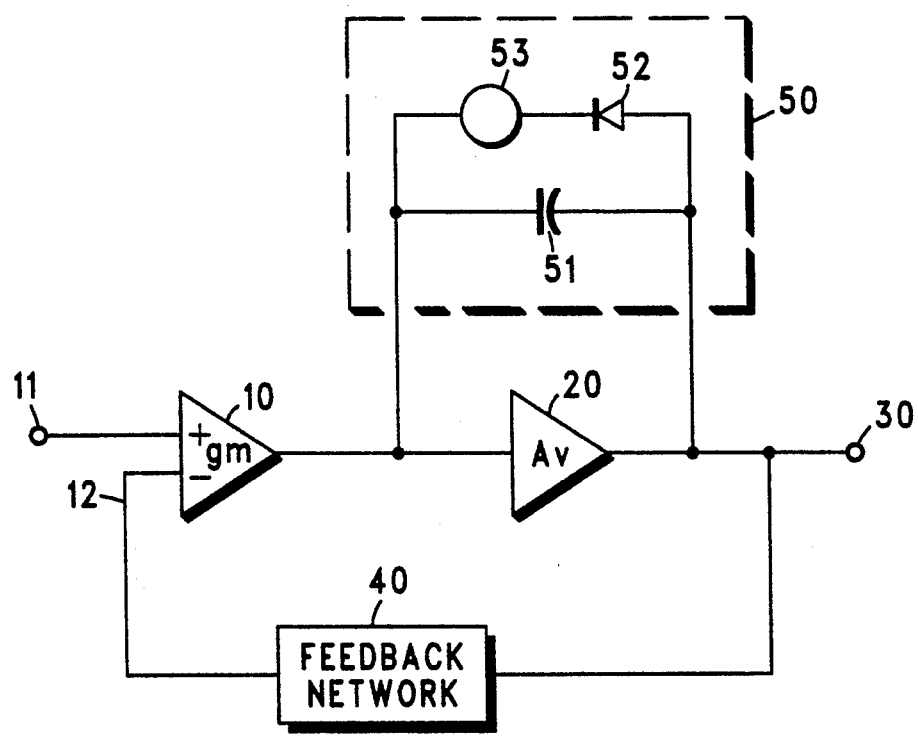

AMPLFIER CIRCUIT

This invention relates to an amplifier circuit and is particularly although not exclusively applicable to a video amplifier.

Amplifier circuits are conveniently implemented by means of operational amplifiers and a typical such circuit consists of a transconductance amplifier followed by a voltage gain stage.

Such operational amplifier circuits usually include a so-called compensation capacitance across the voltage gain stage so that the amplifier is stable when a desired negative feedback is applied. The compensation capacitance creates a dominant pole in the open loop response of the amplifier, so that the gain is below 0 dB when the phase shift through the amplifier is increased to 360° by higher frequency poles.

A problem arises in that a particular chosen value of the compensation capacitance may only be optimal for ensuring amplifier stability for one value of the output voltage of the amplifier.

This invention seeks to provide an amplifier circuit in which the above problem is mitigated.

According to the invention there is provided an amplifier comprising a transconductance stage in series with a voltage gain stage the transconductance stage having an input for receiving an input signal, capacitive means connected across the voltage gain stage, and having a capacitance whose value is continuously dependent upon the output voltage at the output of the voltage gain stage.

The capacitive means may comprise a voltage controlled capacitance and a source of bias voltage.

The voltage controllable capacitance may be a diode series coupled with the source of bias voltage.

A fixed capacitance may be coupled in parallel with the series coupled diode and source of bias voltage to adjust the characteristic of the voltage controllable capacitance.

An exemplary embodiment of the invention will now be described with reference to the accompanying drawing which shows an amplifier circuit in accordance with the invention.

The circuit comprises a transconductance stage 10 having a first input terminal 11 (non-inverting input terminal) for receiving an input signal to be amplified and an inverting input terminal 12.

The transconductance stage 10 is coupled in series with and drives a voltage gain stage 20 to provide a first output signal at an output terminal 30.

In order to control the gain of the amplifier negative feedback means in the form of a feedback network 40 is coupled between the output 30 of the voltage gain stage 20 and the input terminal 12 of the tranconductance stage 10.

To control the stability of the amplifier capacitive means comprising compensation capacitance 50 is connected across the voltage gain stage and has a value continuously dependent upon the output voltage at the output terminal 30.

In this embodiment the compensation capacitance 50 comprises a fixed value capacitance 51 in parallel with a series connected diode 52 and voltage source 53. The voltage source 53 coupled to the positive terminal of the diode 52 ensures that the diode is reverse biased to provide the appropriate characteristic of capacitance and the fixed capacitance 51 provides an adjustment of the overall capacitance characteristic.

As the signal level at the output terminal 30 of the voltage gain stage 20 changes, the voltage at the terminal of the diode 52 will change and this will adjust the overall reverse bias voltage across the diode 52 thereby adjusting its capacitance. This adjustment in the capacitance of the diode 52 automatically adjusts the overall capacitance value of the compensation capacitance 50 connected across the voltage gain stage 20, to an appropriate value to maintain the stability of the amplifier over a wide range of signal output levels.

What is claimed is:

1. An amplifier comprising a transconductance stage in series with a voltage gain stage the transconductance stage having an input for receiving an input signal, a compensation capacitance connected across the voltage gain stage for rendering the amplifier stable under predetermined negative feedback and wherein the compensation capacitance has a value which is continuously dependent upon the output voltage at the output of the voltage gain stage, the compensation capacitance comprising a voltage controllable capacitance and a source of bias voltage wherein the voltage controllable capacitance comprises a diode series coupled with the source of bias voltage.

2. The amplifier of claim 1 wherein a fixed capacitance is coupled in parallel with the series coupled diode and the source of bias voltage to adjust the characteristic of the voltage controllable capacitance.

3. An amplifier comprising a transconductance stage in series with a voltage gain stage the transconductance stage having an input for receiving an input signal, a compensation capacitance connected across the voltage gain stage for rendering the amplifier stable under predetermined negative feedback wherein the compensation capacitance has a value which is continuously dependent upon the output voltage at the output of the voltage gain stage and wherein the compensation capacitance includes a diode series coupled with a source of bias voltage.

* * * * *